(12) United States Patent  
Spallas et al.

(10) Patent No.: US 7,109,486 B1
(45) Date of Patent: Sep. 19, 2006

(54) LAYERED ELECTRON BEAM COLUMN AND METHOD OF USE THEREOF

(75) Inventors: James Spallas, Alamo, CA (US); Lawrence Muray, Moraga, CA (US)

(73) Assignee: Novelx, Inc., Lafayette, CA (US)

( * ) Notice: Subject to any disclaimer, the term of this patent is extended or adjusted under 35 U.S.C. 154(b) by 0 days.

(21) Appl. No.: 10/907,525

(22) Filed: Apr. 4, 2005

Related U.S. Application Data

(60) Provisional application No. 60/581,082, filed on Jun. 18, 2004.

(51) Int. Cl.
*H01J 37/304* (2006.01)

(52) U.S. Cl. .................. 250/311; 250/396 R; 250/398; 250/396 ML; 250/306; 250/310; 250/492.2; 355/67

(58) Field of Classification Search ............ None
See application file for complete search history.

(56) References Cited

U.S. PATENT DOCUMENTS

| | | |
|---|---|---|
| 5,122,663 A | 6/1992 | Chang et al. |
| 5,155,412 A | 10/1992 | Chang et al. |
| 6,288,401 B1 | 9/2001 | Chang et al. |
| 6,369,385 B1 * | 4/2002 | Muray et al. ............ 250/306 |
| 6,730,623 B1 * | 5/2004 | Dai ........................ 501/134 |
| 6,914,249 B1 * | 7/2005 | Kienzle et al. ........ 250/396 R |

OTHER PUBLICATIONS

T.H. P. Chang et al., "Multiple Electron-Beam Lithography" (Abstract) Etec Systems, Inc., an Applied Materials Company, 3781 Chang MNE)) 120100 v1; pp. 1-26.
L.P. Muray et al., "Advances In Arrayed Microcolumn Lithography" J.Vac. Sci. Technol. B 18(6) Nov./Dec. 2000.

* cited by examiner

*Primary Examiner*—Jack Berman
*Assistant Examiner*—Zia R. Hashmi
(74) *Attorney, Agent, or Firm*—Squire, Sanders & Dempsey; Aaron Wininger (57) ABSTRACT

An electron beam column package comprises a plurality of layers having components, such as lenses, coupled thereto. The layers may be made of LTCC, HTCC or other layer technology.

23 Claims, 5 Drawing Sheets

LAYERED ELECTRON BEAM COLUMN AND METHOD OF USE THEREOF

PRIORITY REFERENCE TO PRIOR APPLICATIONS

This application claims benefit of and incorporates by reference U.S. patent application Ser. No. 60/581,082, entitled "Advanced Ceramics For Miniature Modular Scanning Electron Microscope Packaging," filed on Jun. 18, 2004, by inventors James P. Spallas, et al.

TECHNICAL FIELD

This invention relates generally to electron beam columns, and more particularly, but not exclusively, provides an electron beam column package for use in scanning electron microscopes, lithography tools, inspection, and other applications.

BACKGROUND

Electron beam columns are used in scanning electron microscopes (SEMs) that image objects and in lithography tools for writing patterns onto semiconductor materials to be used as integrated circuits. Conventional electron beam columns consist of an assembly of components, including lenses and magnets, individually machined out of stainless steel or other alloys and individually assembled, and an electron source. A new electron beam column consisting of a package, microfabricated components, and electron source is proposed. The ideal package for this new column should meet the following criteria:

1. The package, including all the internal and external features required for electron beam column operation, should be scalable to small dimensions.
2. The packaging technology should be capable of printing the interconnects and the required shielding on the compact package with sufficient line widths and spacing to eliminate short and long term failures due to electrical break down or other failure mechanisms like, for example, electromigration.
3. The package should support controlled impedance lines and terminations for high-speed interconnects to deflectors, blankers, and other high-speed column components. These impedance lines are typically strip-line or microstrip-line in configuration with impedances ranging from about 15 to about 150 Ohms.
4. The package should support embedded passive and active devices for on-board drivers, power supplies, monitors, diagnostics, processing, calibration, identification and other electronic functions. This configuration minimizes external circuitry, reduces the number of feed through connections, and allows termination using components mounted directly on the package.
5. The package should support mounting high-speed drivers in close proximity to the electrodes enabling GHz operation.
6. The package should be amenable to production assembly of the components. All connections to the external world should be accessible to pick and place, wire bonding, or other assembly tools. For example, all interconnects might terminate on sufficiently large pads (typically 250× 250 um) located on the topside of the package.
7. The package should be amenable to batch fabrication to minimize production costs.
8. The package should be rigid, mechanically hard, and durable to provide an adequate platform for imaging and, perhaps lithography, and able to survive the rigors of in-field operation and, perhaps, space flight.
9. The package coefficient of thermal expansion (CTE) should be closely matched to all other materials that it is in contact with to prevent drift, misalignment, distortions, fatigue, and other fatal occurrences.
10. The package should be attachable to the housing material, typically aluminum or stainless steel with a hermetic seal using welding, brazing, soldering or epoxy bonding. The package should allow intermediate, CTE transitioning layers, to be patterned on the surface for this purpose, such as, KOVAR.
11. The package should have a sufficiently high breakdown voltage to be electrically reliable and isolated while meeting volume constraints required by the compact design.
12. The package total thickness variation (TTV), flatness and roughness should be minimized to minimize the distortions and aberrations of the assembled column. The package should have, for example, a TTV<±1 mil, flatness <±0.5 mil/in, and RMS roughness <±0.04 mil.
13. The package may be UHV compatible.
14. The electrical interconnects printed internal to the package should be hermetically sealed to improve reliability.
15. The package must be scalable to support multiple electron beam columns in an arrayed assembly.

Conventional electron beam columns and the packages or support apparatus of other embodiments of miniature electron beam columns fail to meet most of these criteria.

Accordingly, a package enabling the proposed new electron beam column and method of use thereof is required that can overcome deficiencies of conventional electron beam columns and past embodiments of miniature electron beam columns by meeting at least some of the above-mentioned criteria.

SUMMARY

The present invention provides an electron beam column package made using layer technologies, such as low-temperature co-fired ceramic. In an embodiment of the invention, the package comprises a plurality of layers, with each of the layers having interconnects thereon; and a component, such as a microfabricated, laser drilled, or otherwise micromachined components like, for example, lenses, deflectors, and blankers, coupled to at least one of the layers.

The present invention further provides a method for using the package in a lithography tool, scanning electron microscope or other device. The method comprises generating an electron beam; focusing the beam within the electron beam column and scanning the beam over a target. The scanning can write a pattern on a wafer or generate reflected, transmitted, or secondary electrons or photons that are collected and used to generate an image or for analysis.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
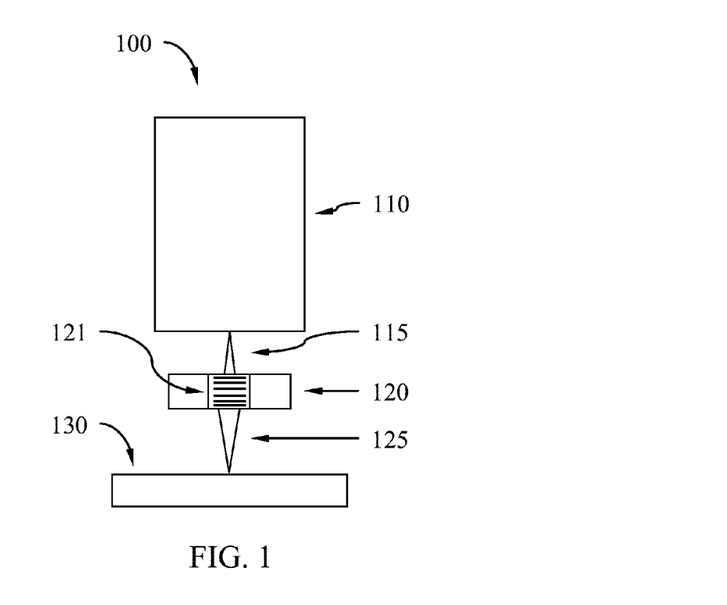
FIG. 1 is a block diagram illustrating an apparatus incorporating an electron beam column.

FIG. 1 is a block diagram illustrating an apparatus 100 incorporating an electron beam column package 120. In embodiments of the invention, the apparatus 100 includes scanning electron microscopes, lithography, inspection, and analysis tools. The apparatus 100 includes an electron source 110 (cathode), such as an thermal field emitter (TFE), positioned adjacent to a beam column package 120, which supports the lenses, deflectors, blankers, magnetic or electrostatic, and other elements required for the column operation (heretofore components) 121. The package 120 and components 121 form the package assembly which is positioned adjacent to a sample holder 130. In an embodiment of the invention, the electron source 110 is positioned above the beam column package 120 and the sample holder 130 is positioned below the beam column package 120.

In an embodiment of the invention, the electron source 110 emits electrons 115 by field assisted thermionic emission. The electron source 110 can also comprise a Tungsten or $LaB_6$ filament, or any of a multitude of cold field emitters, including carbon nanotubes and microfabricated field emission tips. The electrons 115 can have an energy ranging from a few hundred eV to up to about 5 keV. The components 121 coupled to the beam column package 120, which will be discussed in further detail below, extract, collimate, and focus the electrons 115 into an electron beam 125, which is emitted from the package assembly as an electron beam 125. The package assembly scans the focused the beam 125 over the sample holder 130.

In an embodiment in which the apparatus 100 includes a scanning electron microscope, the sample holder 130 holds an object for viewing. The electron beam 125 strikes the object causing the emission of electrons which are detected by a detector (not shown), such as a micro-channel plate (MCP), mounted, in one embodiment, to a mounting plate (not shown) attached to the bottom of the beam column package 120. In an embodiment of the invention, an Everhart-Thornley detector can be used in addition to or in place of the MCP device in order to detect back-scattered and secondary electrons. The detected electrons are then used to generate an image of the object. In an embodiment of the invention, a silicon drift detector (SDD) or other photon detector can be used in addition to or in place of the MCP device in order to detect photons. The detected photons are then used for materials identification and analysis.

In an embodiment in which the apparatus 100 includes a lithography tool, the sample holder 130 holds a wafer onto which patterns for integrated circuits are written by the apparatus 100. The apparatus 100 includes a blanker to blank emission of electrons when necessary to generate the correct pattern on the wafer.

Figure 2:
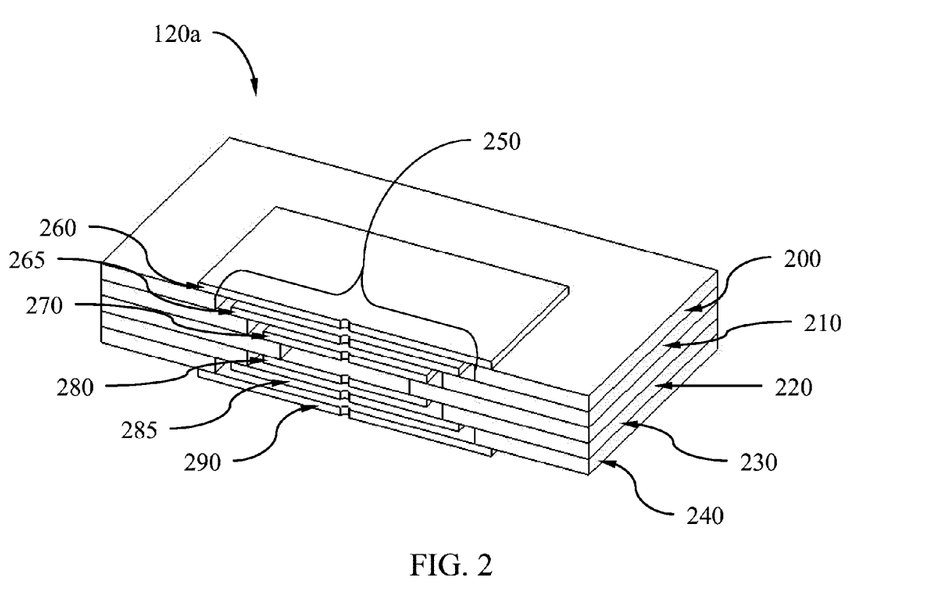
FIG. 2 is a perspective view illustrating an electron beam column package assembly according to an embodiment of the invention.

FIG. 2 is a perspective view illustrating an electron beam column package 120a according to an embodiment of the invention. The beam column package 120 (FIG. 1) can be implemented with the beam column package 120a, the beam column package 120b (FIG. 3) or with other beam columns using the technology described within. The beam column package 120a eliminates individually wired interconnects common to conventional scanning electron microscopes and lithography devices and replaces them with high density, batch-processed, printed circuitry. This is achieved using low temperature co-fired ceramic (LTCC) using, for example, materials from DuPont (e.g., 951 or 943) or Ferro (e.g., A6-S or A6-M), or high-temperature co-fired ceramic (HTCC) using, for example, materials from Kyocera, polyimide, or any other layering technology that produces a rigid package. The beam column package 120a is built layer-by-layer, up to 30 layers or more, and has interconnects strategically distributed on each layer using high-resolution pattern transfer, thereby yielding up to 60 surfaces or more for patterning and enabling the exposed surfaces to be reserved for termination pads for contact to flexible printed circuit (FlexPC) connectors or other high density interface. In contrast, miniature columns fabricated using alternative technologies have incorporated platforms or packages with significantly fewer surfaces for patterning. Each column package 120a is electrically tested and burned in before shipping, thereby improving yield and reducing infant mortality.

In an embodiment in which some or all of the components 260–290 are fabricated on a single layer of silicon or other material, layered technology, such as LTCC technology, significantly reduces the complexity and fabrication time as well as increases reliability and yield of the lens elements. Isolating elements are incorporated in to the column package 120a, thereby eliminating bonded glass spacers or other isolation elements that are individually attached to each lens or component before packaging.

Other advantages of using LTCC or HTCC technology include the ability to batch process and fabricate in high volume; fabrication at very low cost; packages with assembled components can be 100% electrically tested before shipping and are extremely reliable; packages provide a significant increase in real estate available for printed interconnects, ground planes, strip lines, embedded active and passive devices, external active and passive devices; and GHz drivers placed close to the components 121, packages are ultrahigh vacuum compatible; packages are rigid and durable; supporting low-loss high-speed interconnects (>1 GHz) because layered materials, such as LTCC, have low dielectric constants; supporting low-loss high-speed interconnects (>1 GHz) by enabling printing strip-lines and micro-strip-lines; hermetically sealing internal interconnections to prevent reliability failures and provide back to front vacuum isolation; lithographically printing interconnections with good resolution and registration; sufficient real estate for redundancy, scaling, or the addition of electronics or either passive (e.g., resistors, capacitors) or active devices; and FlexPC connectors can easily be integrated with the column.

The beam column package 120a comprises five layers 200–240 stacked one on top of another and six components 260–290. Each layer can have one or more components coupled to it (one per side). In an embodiment of the invention, the component 260 is coupled to a top surface of the layer 200; component 265 is coupled to the top surface of the layer 210, components 270 and 280 are coupled to a top and a bottom surface, respectively, of the layer 220; the component 285 is coupled to a bottom surface of the layer 230; and the component 290 is coupled to a bottom surface of the layer 240. In an embodiment of the invention, the column package 120a can comprise a different number of layers and/or components. A component can include a single device like, for example, a silicon lens element, or a stack of devices like, for example, silicon lenses electrically isolated by an insulator like, for example, Pyrex. The number of devices in a stack not limited.

The top and bottom surface of the layers 200–240 are available for printed circuitry. Each electrical interconnect can be made to terminate at a pad on the top of the layer 200, the bottom of the layer 240, or any combination. Electrical connections between layers are made as needed by vias in the layers 200–240. Connection to external power supplies can be made using, for example, FlexPC connectors.

Pads, as will be discussed in further detail in conjunction with FIG. 5 below, can be printed on each layer 200–240 to allow each component 260–290 to be attached and made electrically connected using either manual techniques or production assembly techniques like, for example, a bump or ball bonding. Each component 260–290 of the column 120a is aligned and attached directly the column 120a. The precise alignment needed can be done using marks printed on each component 260–290 and layer 200–240. The column 120a can have cutouts to view the marks and registration features when the assembly is completed to perform or verify alignment. Pads printed on of the topmost layer 200, bottommost layer 240, or on any other layer whereby a cutout is made to expose a surface can be used for attaching a FlexPC connector or other high density interface to the package using either manual techniques or production assembly techniques like, for example, a bump or ball bonding or soldering. Advantages of using this method may include: assembly is simpler, less labor intensive, more reliable that other techniques used including anodic bonding and epoxy. This is because LTCC is a mature technology that allows batch processing, printed interconnects, and 100% electrical and mechanical testing of the components and subassemblies. The assembly can be done in high volume production using a variety of techniques. There is no contamination or other reliability problem. Layered processing achieves smooth, flat, and parallel surfaces for component attachment. The layer thickness is very well controlled. Electrical connection to a large number of pads is possible. LTCC, HTCC, and other layered process are compatible with lapping and polishing processes which can be used to create packages with extreme parallelism (TTV), flatness, and smoothness.

Each layer 200–240 can be made square shaped (or otherwise shaped) with one or more square, or otherwise, shaped cutouts to enable placement of a component, transmission of electrons, or other function. Components 260–290 may include discrete elements like lenses, deflectors, blankers, etc., or assemblies of elements such as fabricated lens or deflector stacks. Layers can vary in thickness, for example from 3.7 to 8.2 mils for LTCC and significantly more for HTCC and polyimide processes. Each layer 200–240 can have the same thickness or their thicknesses can vary from each other.

The column package 120a has an hourglass shape designed to minimize the overall package size and maximize the real estate available for printed circuitry. The cutouts in each layer 210–230 decreases in at least one dimension from the top layer 200 and the bottom layer 240 to the center layer 220, which allows each component 260–290 access to its' corresponding layer. The minimum dimension of the cutout 250 is determined by the minimum practical size of component 270, the minimum required contact region at each layer, and the number of components.

Figure 3:
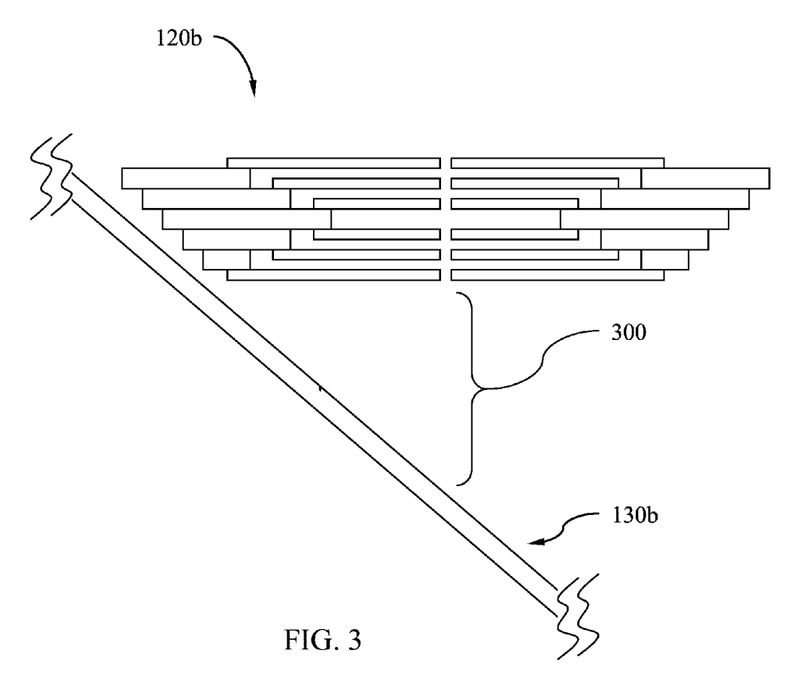
FIG. 3 is a cross section illustrating an electron beam column package assembly according to another embodiment of the invention.

FIG. 3 is a cross section illustrating an electron beam column package 120b according to another embodiment of the invention. The beam column package 120b has a tapered design using a plurality of layers with decreasing length and width from a top layer to a bottom layer to enable high-resolution imaging and analysis on a tilted sample when used in a scanning electron microscope. In a lithography tool embodiment, the package 120b enables writing a pattern on a tilted wafer. The beam column package 120b, like the beam column package 120a, is assembled layer-by-layer. The layer-by-layer assembly of the beam column package 120b makes the tapered column package 120b possible. The tapered portion of the package allows the sample under test (SUT) or wafer on a sample holder 130b to be brought closer the column package 120b for a given tilt angle than would otherwise be possible if the column package 120b was not tapered. This design allows the working distance 300 (i.e., the distance between the bottom of the column and the sample holder 130b) to be minimized for any tilt angle to enable optimum resolution and collection efficiency without being restricted by the presence of the column package 120b.

Pads, as will be discussed in further detail in conjunction with FIG. 5 below, can be printed on the exposed ledges of the tapered design providing additional techniques of electrical interconnection to the components attached to the package. For this embodiment, the taper can either be tapered down as shown in FIG. 3, or up, or in both directions, be created by square or circular cutouts, and be designed to create a tapered profile in part or all of the package.

Figure 4:
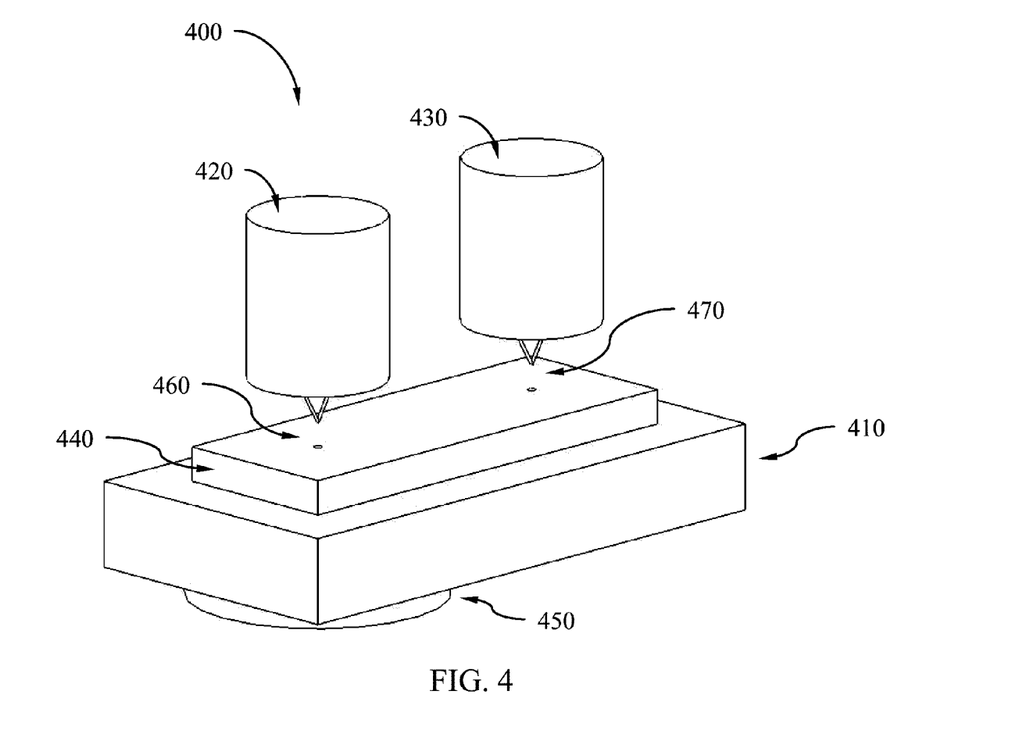
FIG. 4 is a diagram illustrating an array of electron beam columns.

FIG. 4 is a diagram illustrating a 1×2 array of electron beam columns 400 including columns 460 and 470. The arrayed column package 410 is monolithically fabricated and has the same functionality as two individual column packages like 120a and/or 120b. The illustration shows two electron sources 420 and 430, a monolithically fabricated stacked lens 440, and an electron detector 450, like, for example, an MCP detector. A second electron detector can be added. The package 410 can include additional components like deflectors and additional lenses (not shown). While the package 410 is designed to support the operation of two beam columns, it will be appreciated by one of ordinary skill in the art that the package 410 may be designed to support additional beam columns.

In an embodiment of the invention, the two columns 460 and 470 can be identical or each designed for a specific application. The unit can be designed to stand-alone just like a single column configuration. The array 400 can be a 1×2 electron beam column, for example, whereby one column is designed to be a dedicated imaging tool while the column is designed to be a dedicated analysis tool. In another embodiment, column 470 may be a lithography tool and the column 460 may be an imaging tool to verify patterns written by the lithography tool The column array 400 in this example contains all the needed components and interconnection for each individual and unique column making up the array. This configuration, and any other configuration that includes multiple columns with any orientation relative to each other and the package, is possible because layer technology, such as LTCC technology, enables high density interconnect printing and batch assembly of large substrates (typically up to 6×6 in). There are many advantages to this configuration:

1. Column-to-column distances and alignment are precise because the package can be made to support monolithic components defined by IC manufacturing processes. This precision cannot be matched by the manual alignment of two discrete packages.

2. The labor intensive, time consuming, and difficult process of aligning two or more packaged column is eliminated thereby lowing cost, increasing yield, and improving throughput. This is increasingly important as the array size increases.

3. The package is a single body with identical and uniform properties throughout. For example, there are no thermal gradients resulting from non-uniform coefficient of thermal expansion (CTE) or from voids or the application of other materials like epoxy or metal bonds.

Figure 5A:
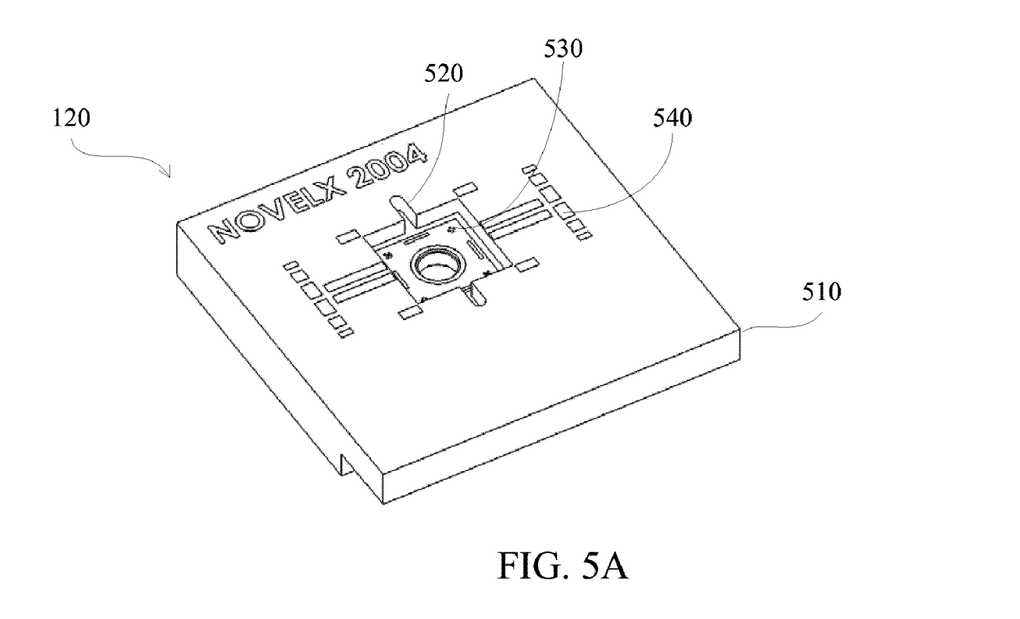
FIG. 5A and FIG. 5B are diagrams illustrating perspective views of a top and bottom, respectively, of the package.
Figure 5B:
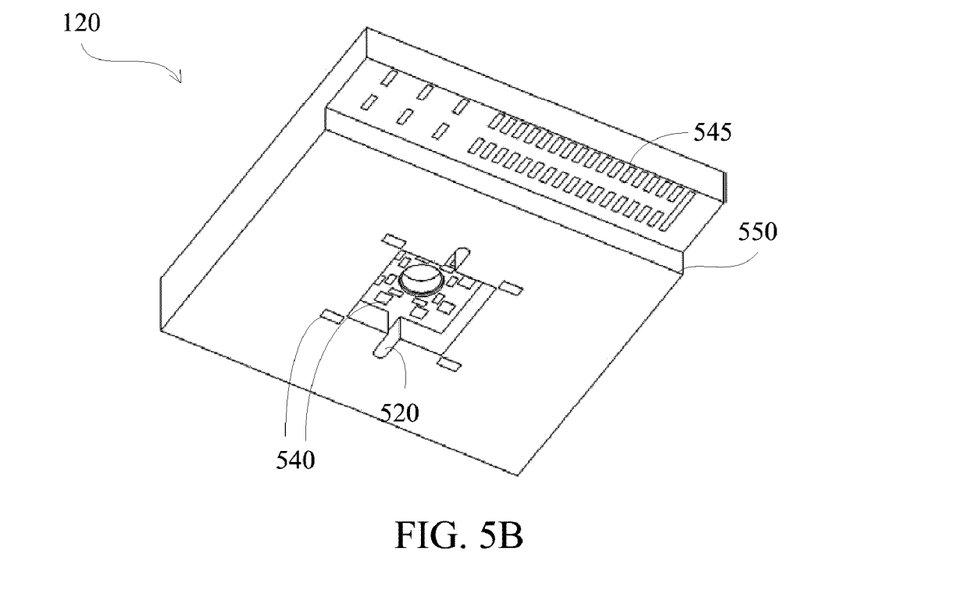

FIGS. 5A and 5B are diagrams illustrating perspective views of a top 510 and bottom 550 of the beam column package 120. The top 510 and bottom 550 include vent cutouts 520, which provide a path for gas to escape during pump down preventing a virtual leak, and contact pads 540 and 545. The alignment fiducials 530 enable the accurate placement and coupling of components, such as component 270, to the beam column package 120. The contact pads 540 enable electrical contact between a component, such as the component 260, or other element, and external equipment such as a power supply or computer. In the embodiment shown in FIG. 5, discrete circuits can be attached to pads 540 on the top 510. A FlexPC connector can be attached to pads 545. The contact pads 540 are connected to the pads 545 through vias and interconnects internal to the package 120 providing electrical continuity to external equipment such as a power supply or computer. The external equipment, such as GHZ drivers, digital signal processors, microcontrollers, field programmable gate arrays, etc., can also be mounted directly to the beam column package 120 by placing pads on the top 510 and/or bottom 550 of the package. The pads 540 can be located at easily accessible surfaces and also at locations where a component will be placed, to enable electrical communication between the component and the pads 540 and external equipment. The package in FIG. 5 is nominally 1.1×1.1×0.2 in.

Figure 6:
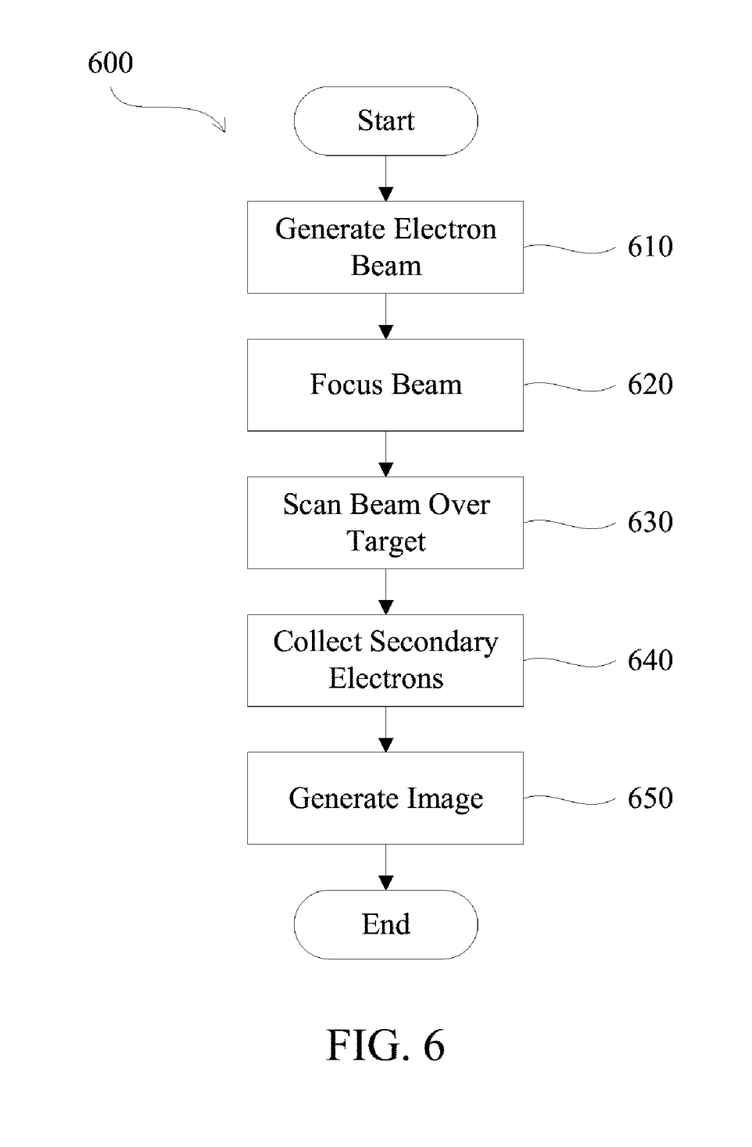
FIG. 6 is a flowchart illustrating a method of using an electron beam column for imaging.

FIG. 6 is a flowchart illustrating a method 600 of using an electron beam column package 120. First an electron beam is generated (610). The beam is then is focused (620) using focusing components coupled to beam column package 120. The beam is then scanned (630) over a target, also using components, e.g., a dual octupole, in the column package 120. The scanned beam impacts the target, generating backscattered and secondary electrons (and/or x-rays), which are collected (640) by a detector. An imaging device then generates (650) an image based on the collected electrons. The method 600 then ends. When the target includes a wafer, the scanning (630) can cause the imprinting of a pattern for a circuit onto the wafer.

The foregoing description of the illustrated embodiments of the present invention is by way of example only, and other variations and modifications of the above-described embodiments and methods are possible in light of the foregoing teaching. For example, while the above embodiments describe using the packages for electrons, charged particles (ions) of any type could be used in place of or in addition to electrons. Further, connections may be wired, wireless, modem, etc. The embodiments described herein are not intended to be exhaustive or limiting. The present invention is limited only by the following claims.

What is claimed is:

1. A charged particle beam column package, comprising:
   a plurality of layers, at least one of the layers having interconnects thereon; and
   a component coupled to at least one of the layers;
   wherein the plurality of layers is made from LTCC or HTCC;
   wherein the plurality of layers have fiducials thereon to enable component-to-component and component-to-column alignment.

2. The charged particle beam column package of claim 1, further comprising passive or active devices on at least one of the plurality of layers.

3. The charged particle beam column package of claim 1, wherein the column has an hourglass shape.

4. The charged particle beam column package of claim 1, wherein the column has a tapered shape.

5. The charged particle beam column package of claim 1, wherein each layer has two surfaces available for the interconnects.

6. The charged particle beam column package of claim 1, wherein the interconnects are terminated at at least two pads located in the column package through vias and interconnects in each layer to create electrical continuity with external equipment.

7. A scanning microscope incorporating the charged particle beam column package of clam 1.

8. A lithography tool incorporating the charged particle beam column package of claim 1.

9. An analysis tool incorporating the charged particle beam column package of claim 1.

10. An inspection tool incorporating the charged particle beam column package of claim 1.

11. A method, comprising:
    generating a charged particle beam;
    focusing the beam within a charged particle beam column package, the beam column package having a plurality of layers, at least one of the layers having interconnects thereon, and a component coupled to at least one of the layers, wherein the plurality of layers is made from LTCC or HTCC, wherein the plurality of layers have fiducials thereon to enable component-to-component and component-to-column alignment; and
    scanning the beam over a target.

12. The method of claim 11, further comprising passive or active devices on at least one of the plurality of layers.

13. The method of claim 11, wherein the column package has an hourglass shape.

14. The method of claim 11, wherein the column package has a tapered shape.

15. The method of claim 11, wherein each layer has two surfaces available for the interconnects.

16. The method of claim 11, wherein the interconnects are terminated at at least two pads located in the column package through vias and interconnects in each layer to create electrical continuity with external equipment.

17. The method of claim 11, further comprising:
collecting electrons or photons from the target; and
generating an image based on the collected electrons or photons.

18. The method of claim 11, wherein the target is a wafer and wherein the scanning imprints a pattern onto the wafer for a circuit.

19. The beam column package of claim 1, wherein one of the layers supports two lens assemblies.

20. The beam column package of claim 19, wherein the layer supporting two lens assemblies supports one of the lens assemblies at a top surface of the layer and supports the other layer at a bottom surface of the layer.

21. A method, comprising:
generating a charged particle beam;
focusing the beam within a charged particle beam column package, the beam column package having a plurality of ceramic layers, at least one of the layers having printed interconnects thereon; and a lens assembly supported by one of the layers; and
scanning the beam over a target.

22. The method of claim 21, wherein one of the layers supports two lens assemblies.

23. The method of claim 22, wherein the layer supporting two lens assemblies supports one of the lens assemblies at a top surface of the layer and supports the other layer at a bottom surface of the layer.

* * * * *